United States Patent
Tomonari et al.

(10) Patent No.: US 10,149,417 B2
(45) Date of Patent: Dec. 4, 2018

(54) MAGNETISM SUPPRESSING SHEET AND MANUFACTURING METHOD THEREOF

(71) Applicant: TDK CORPORATION, Tokyo (JP)

(72) Inventors: Toshio Tomonari, Tokyo (JP); Hirohumi Asou, Tokyo (JP); Toshihiro Kuroshima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/710,831

(22) Filed: May 13, 2015

(65) Prior Publication Data
US 2015/0334885 A1    Nov. 19, 2015

(30) Foreign Application Priority Data

May 14, 2014  (JP) .................................. 2014-100831
May 14, 2014  (JP) .................................. 2014-100832

(51) Int. Cl.
*H05K 9/00* (2006.01)
*C23C 18/16* (2006.01)
*C23C 18/31* (2006.01)

(52) U.S. Cl.
CPC ......... *H05K 9/0083* (2013.01); *C23C 18/165* (2013.01); *C23C 18/31* (2013.01); *H05K 9/0075* (2013.01); *H05K 9/0084* (2013.01); *H05K 9/0088* (2013.01); *Y10T 428/24314* (2015.01); *Y10T 428/31678* (2015.04); *Y10T 428/31681* (2015.04)

(58) Field of Classification Search
CPC .. H05K 9/0083; H05K 9/0084; H05K 9/0088; H05K 9/0075; C23C 18/165; C23C 18/31; Y10T 428/31678; Y10T 428/31681; Y10T 428/24314
USPC .......................... 428/136, 457, 458; 427/131
See application file for complete search history.

(56) References Cited

U.S. PATENT DOCUMENTS

| 4,392,083 A * | 7/1983 | Costello ................ H01J 29/867 174/371 |
| 2007/0036888 A1 | 2/2007 | Funaki et al. |
| 2009/0316370 A1* | 12/2009 | Kawaguchi ............... H01F 1/00 361/748 |
| 2014/0239892 A1* | 8/2014 | Sawa ...................... H01F 38/14 320/108 |

FOREIGN PATENT DOCUMENTS

| JP | H07-212079 | 8/1995 |
| JP | H09-312489 | 12/1997 |

(Continued)

OTHER PUBLICATIONS

Machine Translation of JP H07-212079. 1995.*
Machine Translation of JP 2004-273751. 2004.*
Machine Translation of JP H09-312489. 1997.*

*Primary Examiner* — Brian Handville
(74) *Attorney, Agent, or Firm* — Young Law Firm, P.C.

(57) ABSTRACT

A magnetism suppressing sheet is provided with a metallic foil formed by plating and a magnetic film formed by applying magnetic metal powder-containing resin paste to one main surface of the metallic foil. A manufacturing method of a magnetism suppressing sheet includes the steps of preparing a support film on which a metallic foil has been formed, and forming a magnetic film by applying a magnetic metal powder-containing paste to one main surface of the metallic foil.

12 Claims, 7 Drawing Sheets

(56) References Cited

FOREIGN PATENT DOCUMENTS

| | | | |
|---|---|---|---|
| JP | 2000-348916 A | 12/2000 | |
| JP | 2001135976 A | 5/2001 | |
| JP | 2002118008 A | 4/2002 | |
| JP | 2004-273751 | 9/2004 | |
| JP | 2004303824 A | 10/2004 | |
| JP | 2005-108911 | 4/2005 | |
| JP | 2013065675 A | 11/2013 | |
| KR | 20130014702 A | 2/2013 | |
| WO | WO2013069270 A1 * | 5/2013 | ............ H01F 38/14 |

* cited by examiner

MAGNETISM SUPPRESSING SHEET AND MANUFACTURING METHOD THEREOF

BACKGROUND OF THE INVENTION

Field of the Invention

The present invention relates to a magnetism suppressing sheet that suppresses radiation of electromagnetic wave noise from a noise source and a manufacturing method thereof.

Description of Related Art

In recent years, a mobile electronic apparatus such as a smart phone is strongly required to take countermeasures against noise. As one of the noise suppression methods, there is a method that covers a noise source with a magnetism suppressing sheet so as to protect an internal circuit from external noise and prevent unnecessary radiation of noise generated in the apparatus. For example, Japanese Patent Application Laid-Open No. H07-212079 discloses, in FIG. 4, an electromagnetic wave interference suppressor that includes a conductive support and an insulating soft magnetic material layer provided at least on one surface of the conductive support, wherein the conductive support is formed of a metal plate. Further, Japanese Patent Application Laid-Open No. H09-312489 discloses, in FIG. 4, a countermeasure against EMI using an electromagnetic interference suppressor including a composite magnetic body constituted of soft magnetic powder and an organic binder and a conductive layer formed, by plating, on an outside surface of the composite magnetic body.

However, the electromagnetic wave interference suppressor disclosed in Japanese Patent Application Laid-Open No. H07-212079 uses a metal plate as the conductive support, so that reduction in thickness of the conductive support is difficult. Further, in the electromagnetic interference suppressor disclosed in Japanese Patent Application Laid-Open No. H09-312489, the conductive layer is formed, by plating, on the surface of the composite magnetic body, so that formation of a thin and uniform (in thickness) plating film is difficult.

SUMMARY

An object of the present invention is therefore to provide a thin-type magnetism suppressing sheet having high noise absorbing performance and easy to manufacture and a manufacturing method thereof.

To solve the above problems, a magnetism suppressing sheet according to a first aspect of the present invention includes a metallic foil formed by plating and a magnetic film formed by applying magnetic metal powder-containing resin paste to one main surface of the metallic foil.

According to the present invention, the metallic foil is very thin and uniform, and a support film for supporting the metallic foil is not provided, so that reduction in thickness of the entire magnetism suppressing sheet can be achieved. Further, electromagnetic wave noise that has not been fully absorbed by the magnetic film is reflected by the metallic foil to be returned to the magnetic film, thereby enhancing electromagnetic wave noise absorbing performance.

It is preferable that the magnetism suppressing sheet according to the present invention further includes a support film that is made of insulating material and supports the metallic foil and that the metallic foil is formed electroless plating on one main surface of the support film. With this configuration, insulating performance with respect to the metallic foil can be enhanced. Further, the metallic foil is not plated on the surface of the magnetic film, but formed on the surface of the support film by electroless plating, so that the metallic foil can be formed very thinly and uniformly.

In the present invention, a material of the support film is preferably PET (polyethylene terephthalate), and a material of the metallic foil is preferably Cu. Using these materials allows the metallic foil to be formed thinly and uniformly and allows easy removal of the support film from the metallic foil.

The magnetism suppressing sheet according to the present invention is preferably installed with the magnetic film facing a noise source side. Electromagnetic wave noise from the noise source enters the magnetism suppressing sheet and is absorbed by the magnetic film while passing therethrough. A part of the electromagnetic wave noise that has not been absorbed by the magnetic film is reflected by the metallic foil and is absorbed by the magnetic film once again while passing therethrough once again, thereby enhancing noise absorbing performance.

In the present invention, it is preferable that a lattice-like slit is formed in the metallic foil and that the metallic foil is divided into a plurality of blocks insulated and separated from each other by the slit. With this configuration, it is possible to prevent occurrence of short-circuit between circuits or components through the metallic foil. Further, a slit formation position is reduced in adhesion to the support film, making it easier to remove the support film.

To solve the above problems, a manufacturing method of a magnetism suppressing sheet according to a second aspect of the present invention includes the steps of: preparing a support film on which a metallic foil has been formed; and forming a magnetic film by applying a magnetic metal powder-containing paste to one main surface of the metallic foil.

According to the present invention, it is possible to form a thin and uniform metallic foil, thereby manufacturing a thin-type magnetism suppressing sheet having high electromagnetic wave noise absorbing performance.

In the present invention, the step of preparing the support film on which the metallic foil has been formed preferably includes a step of forming the metallic foil by electroless plating on one main surface of the support film and further preferably includes a step of applying resin containing a catalyst to the one main surface of the support film before forming the metallic foil by electroless plating. With this method, it is possible to form a thin and uniform metallic layer and to easily remove the support film from the metallic foil.

The manufacturing method of a magnetism suppressing sheet according to the present invention preferably further includes a step of removing the support film from the metallic foil. With this method, a very thin magnetism suppressing sheet can be provided.

To solve the above problems, a magnetism suppressing sheet according to a third aspect of the present invention includes a metallic foil in which a lattice-like slit has been formed and a magnetic film formed on one main surface of the metallic foil, wherein the metallic foil is divided into a plurality of blocks insulated and separated from each other by the slit.

According to the present invention, the metallic foil is very thin and uniform, and a support film for supporting the metallic foil is not provided, so that reduction in thickness of the entire magnetism suppressing sheet can be achieved. Further, electromagnetic wave noise that has not been fully absorbed by the magnetic film is reflected by the metallic foil to be returned to the magnetic film, thereby enhancing electromagnetic wave noise absorbing performance. Further, it is possible to prevent occurrence of short-circuit between circuits or components through the metallic foil. Further, a slit formation position is reduced in adhesion to the support film, making it easier to remove the support film.

It is preferable that the magnetism suppressing sheet according to the present invention further includes a support film that is made of insulating material and supports the metallic foil. With this configuration, insulating performance with respect to the metallic foil can be enhanced. Further, the metallic foil can be formed on the surface of the support film by electroless plating, and can therefore be formed very thinly and uniformly.

In the present invention, a material of the support film is preferably PET (polyethylene terephthalate), and a material of the metallic foil is preferably Cu. Using these materials allows the metallic foil to be formed thinly and uniformly and allows easy removal of the support film from the metallic foil.

In the present invention, the magnetism suppressing sheet is preferably installed with the magnetic film facing a noise source side. Electromagnetic wave noise from the noise source enters the magnetism suppressing sheet and is absorbed by the magnetic film while passing therethrough. A part of the electromagnetic wave noise that has not been absorbed by the magnetic film is reflected by the metallic foil and is absorbed by the magnetic film once again while passing therethrough once again, thereby enhancing noise absorbing performance.

To solve the above problems, a manufacturing method of a magnetism suppressing sheet according to a fourth aspect of the present invention includes the steps of: forming, on one main surface of a support film, a metallic foil in which a lattice-like slit has been formed; and forming a magnetic film by applying a magnetic metal powder-containing paste to one main surface of the metallic foil.

In the present invention, the step of forming the metallic foil preferably includes a step of forming the metallic foil by electroless plating on the one main surface of the support film and includes a step of screen printing resin containing a catalyst on the one main surface of the support film using a mask having a pattern of the lattice-like slit before forming the metallic foil by electroless plating. With this method, it is possible to form a thin and uniform metallic layer in which the lattice-like slit has been formed and to easily remove the support film from the metallic foil.

The manufacturing method of a magnetism suppressing sheet according to the present invention preferably further includes a step of removing the support film from the metallic foil. With this method, a very thin magnetism suppressing sheet can be provided.

According to the present invention, there can be provided a thin-type magnetism suppressing sheet having high noise absorbing performance and easy to manufacture and a manufacturing method thereof.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
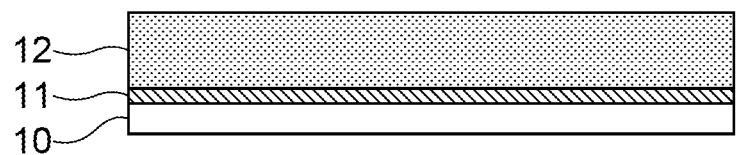
FIG. 1 is a schematic cross-sectional view illustrating a structure of a magnetism suppressing sheet according to a first embodiment of the present invention.

FIG. 1 is a schematic cross-sectional view illustrating a structure of a magnetism suppressing sheet according to a first embodiment of the present invention.

As illustrated in FIG. 1, a magnetism suppressing sheet 1 includes a support film 10, a metallic foil 11 formed on one main surface (upper surface) of the support film 10, and a magnetic film 12 formed on one main surface (upper surface) of the metallic foil 11. The magnetism suppressing sheet is provided on a casing surface, a surface of a substrate on which electronic components are mounted, an upper surface of an IC chip, an outer periphery of a connector, and the like so as to suppress radiation of electromagnetic wave noise generated from a circuit or a component incorporated in a mobile electronic apparatus such as a smartphone. A planar size of the magnetism suppressing sheet 1 can be appropriately set according to the intended purpose. Specifically, the planar size can be set to, e.g., 30 mm×50 mm.

The support film 10 serves not only to support the metallic foil 11 but also to insulate and coat the metallic foil 11 so as to prevent the incorporated circuit or component from being short-circuited by the metallic foil 11. For example, as a material of the support film 10, insulating resin such as PET (polyethylene terephthalate) is preferably used. A thickness of the support film 10 can be set to, e.g., 20 μm.

The metallic foil 11 is provided for forming an electromagnetic wave noise reflecting surface and an electromagnetic wave noise shielding surface. The metallic foil 11 is preferably made of Cu in terms of shielding characteristics, workability, and material cost. A thickness of the metallic foil 11 is preferably in a range of 1 μm to 5 μm. When the thickness of the metallic foil 11 is less than 1 μm, handling of the metallic foil 11 becomes difficult, and the metallic foil may be broken. Further, even when the thickness of the metallic foil 11 is increased to more than 5 μm, the shielding effect is not enhanced, and other advantageous effects are not produced. As described above, reducing the thickness of the metallic foil 11 as much as possible within a range where the effect of the metallic foil 11 is exhibited can contribute to reduction in the thickness of the sheet and material cost while ensuring freedom of layout.

The magnetic film 12 serves to absorb electromagnetic wave noise and is made of magnetic metal powder-containing resin obtained by dispersing magnetic metal powder in a resin binder. A thickness of the magnetic film 12 is preferably in a range of 25 μm to 100 μm. When the thickness of the magnetic film 12 is less than 25 μm, the effect of the magnetic film 12 cannot be obtained. Further, when the magnetic film 12 is formed by application of a magnetic metal powder-containing resin paste, it is difficult to form the paste very thinly and uniformly without unevenness. Further, even when the thickness of the magnetic film 12 exceeds 100 μm, the effect of the magnetic film 12 is not enhanced, but the thickness of the entire magnetism suppressing sheet 1 is unnecessarily increased.

The magnetic metal powder contained in the magnetic metal powder-containing resin functions as an electromagnetic wave attenuating material and is preferably permalloy (Fe—Ni alloy), superpermalloy (Fe—Ni—Mo alloy), sendust (Fe—Si—Al alloy), Fe—Si alloy, Fe—Co alloy, Fe—Cr alloy, Fe—Cr—Si alloy or the like. Further, examples of the resin binder include phenol resin, urea resin, melamine resin, polytetrafluoroethylene, polyethylene, polypropylene, polystyrene, polyether sulfone, polyphenylene sulfide, PET, PET, polyarylate, silicon resin, diallyl phthalate, and polyimide.

Figure 2:
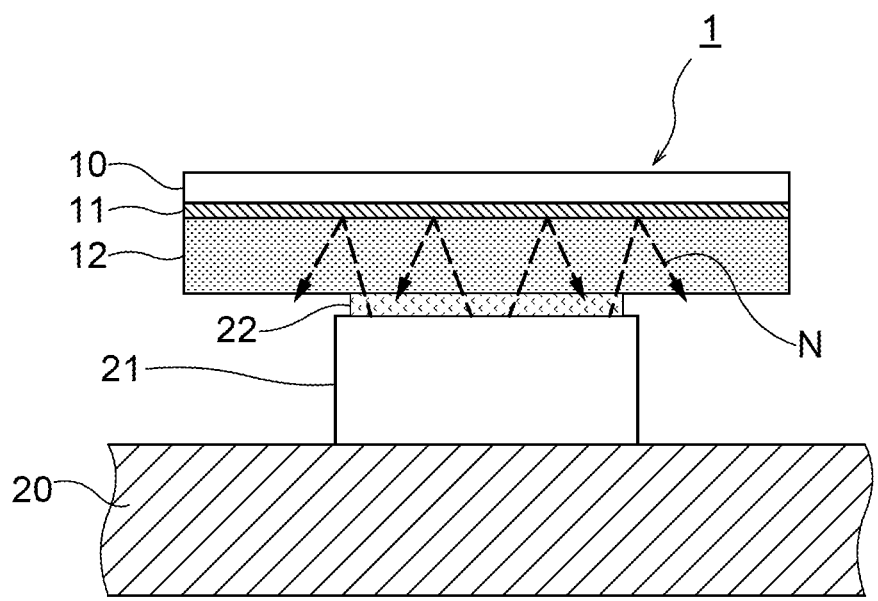
FIG. 2 is a schematic cross-sectional view illustrating an example of a use state of the magnetism suppressing sheet.

FIG. 2 is a schematic cross-sectional view illustrating an example of a use state of the magnetism suppressing sheet 1.

As illustrated in FIG. 2, the magnetism suppressing sheet 1 is bonded to an upper surface of a noise source (electronic component 21) on a printed board 20 through an adhesive layer 22. A mounting direction of the magnetism suppressing sheet 1 is set such that the magnetic film 12 faces the electronic component 21 side. Electromagnetic wave noise N (indicated by dashed arrows) generated from the electronic component 21 enters the magnetism suppressing sheet 1 and passes through the magnetic film 12. Upon passage through the magnetic film 12, a part of the electromagnetic wave noise N is absorbed. The remaining electromagnetic wave noise N, that is, a part of the electromagnetic wave noise N that has not been absorbed by the magnetic film 12 is reflected by the metallic foil 11 and passes through the magnetic film 12 once again, so that the electromagnetic wave noise N is absorbed once again. In this manner, the magnetic film 12 acts on the incident electromagnetic wave noise twice, thereby enhancing noise absorbing performance.

The magnetism suppressing sheet 1 according to the above first embodiment can be used in a state where the support film 10 bonded to the surface of the metallic foil 11 has been removed.

Figure 3:
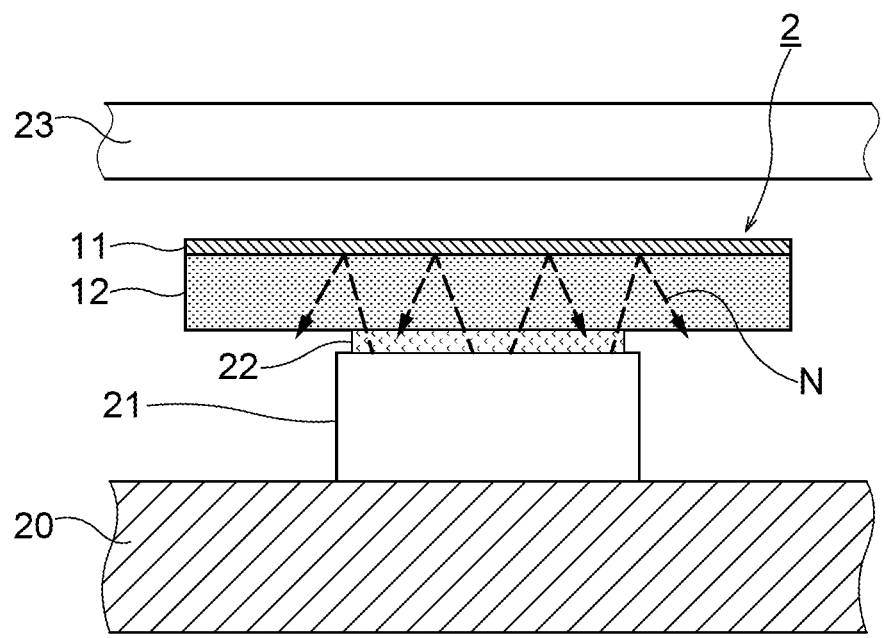
FIG. 3 is a schematic cross-sectional view illustrating a structure of a magnetism suppressing sheet according to a second embodiment of the present invention together with an example of a use state thereof.

FIG. 3 is a schematic cross-sectional view illustrating a structure of a magnetism suppressing sheet according to a second embodiment of the present invention together with an example of a use state thereof.

As illustrated in FIG. 3, a magnetism suppressing sheet 2 is obtained by removing the support film 10 from the magnetism suppressing sheet 1 according to the first embodiment and includes a metallic foil 11 and a magnetic film 12 formed on one main surface (upper surface) of the metallic foil 11. The magnetism suppressing sheet 2 is bonded to an upper surface of a noise source (electronic component 21) on a printed board 20 through an adhesive layer 22 with the magnetic film 12 facing the electronic component 21 side.

When a resin cover 23 functioning as a casing is closely disposed above the magnetism suppressing sheet 2 bonded to the upper surface of the electronic component 21 as the noise source to almost eliminate a possibility that the metallic foil 11 of the magnetism suppressing sheet 2 contacts other metallic components, the support film 10 as the insulating coating material becomes unnecessary and may disadvantageously cause increase in thickness or weight of the magnetism suppressing sheet. In such a case, by using the magnetism suppressing sheet 2 of the present embodiment in which the support film 10 has been removed, reduction in thickness and weight of the magnetism suppressing sheet can be achieved. According to the second embodiment, under such a circumstance that a recent mobile electronic apparatus typified by a smartphone is required to be reduced in thickness to a minimum, it is possible to enhance installation freedom of the magnetism suppressing sheet 2 and achieve reduction in thickness and weight of a mobile electronic apparatus such as a smartphone on which the magnetism suppressing sheet 2 is installed.

Figure 4:
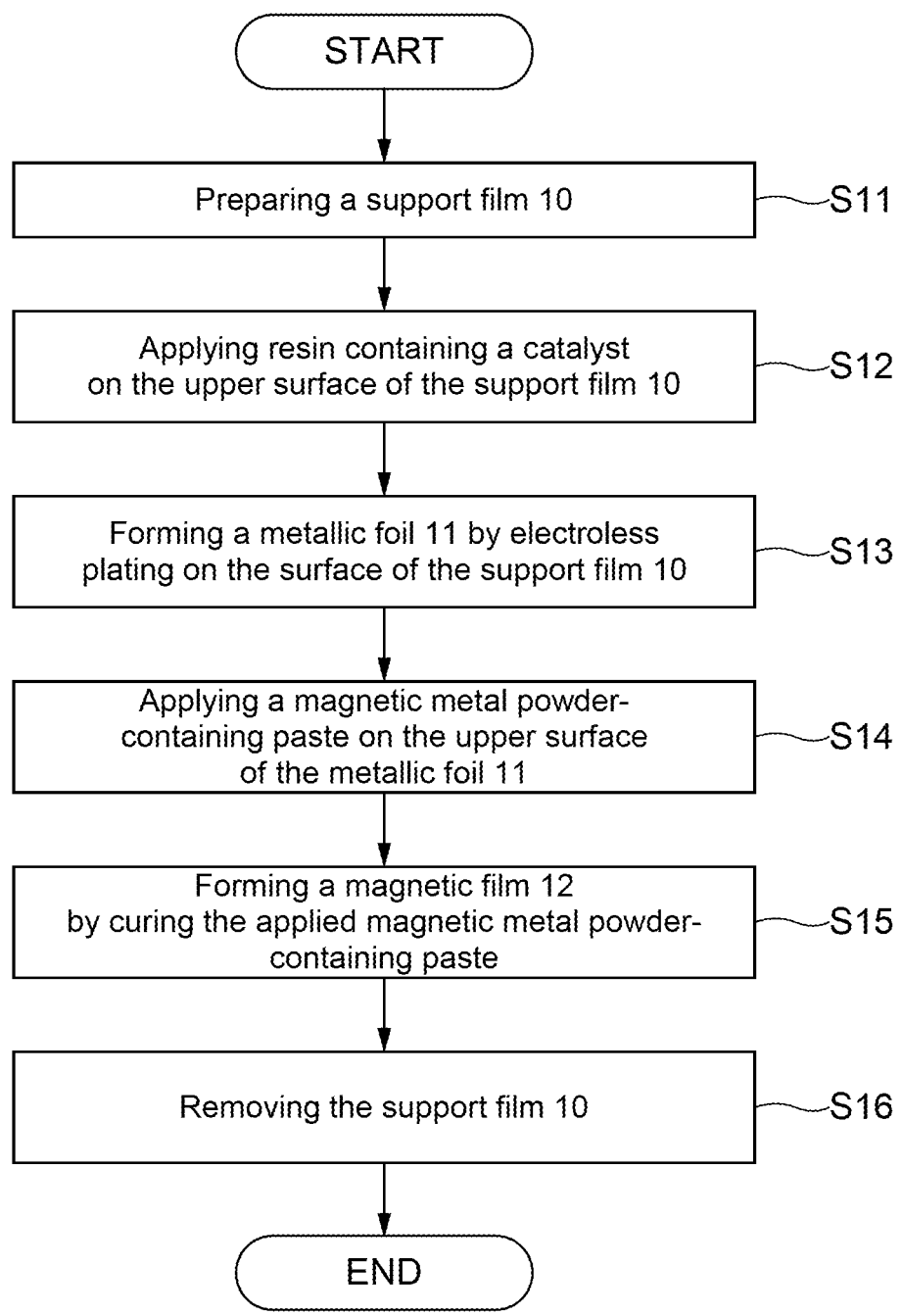
FIG. 4 is a flowchart for explaining a manufacturing method of the magnetism suppressing sheet.

FIG. 4 is a flowchart for explaining a manufacturing method of the magnetism suppressing sheet 1.

As illustrated in FIG. 4, in a manufacturing process of the magnetism suppressing sheet 1, a support film 10 is prepared first (step S11), and then resin containing a catalyst for electroless plating is formed, by application, on the upper surface of the support film 10 (step S12). For example, as the support film 10, a PET film having a thickness of 20 μm can be used. Further, as the resin containing the catalyst, epoxy resin containing palladium can be used.

Subsequently, a metallic foil 11 is formed by electroless plating on the surface of the support film 10 to which the resin containing the catalyst has been applied (step S13). The material of the metallic foil 11 is preferably Cu, and the thickness of the metallic foil 11 is preferably in a range of 1 μm to 5 μm. Application of the resin containing the catalyst to the entire surface of the support film 10 allows the metallic foil 11 to be formed on the entire surface of the support film 10.

Subsequently, a magnetic film 12 having a thickness of 25 μm to 100 μm is formed on the upper surface of the metallic foil 11. Specifically, the magnetic film 12 can be formed by applying a magnetic metal powder-containing paste on the upper surface of the metallic foil 11 and curing the applied magnetic metal powder-containing paste (steps S14 and S15). Through such processes, the magnetism suppressing sheet 1 illustrated in FIG. 1 is completed. Further, by removing the support film 10 from a laminated body of the metallic foil 11 and the magnetic film 12 as necessary (step S16), the magnetism suppressing sheet 2 illustrated in FIG. 3 is completed.

As described above, the magnetism suppressing sheet 1 according to the present embodiment includes the metallic foil 11 formed on the support film 10 and the magnetic film 12 formed on the surface of the metallic foil 11. In the thus configured magnetism suppressing sheet 1, electromagnetic wave noise that has not been fully absorbed by the magnetic film 12 is reflected by the metallic foil 11 to be returned to the magnetic film 12, thereby enhancing electromagnetic wave noise absorbing performance. Further, the magnetic film 12 is formed by applying the magnetic metal powder-containing paste to the surface of the metallic foil 11, and thus adhesion between the metallic foil 11 and the magnetic film 12 is high, thus allowing easy removal of the support film 10 from the metallic foil 11. Further, the metallic foil 11 is not plated on the surface of the magnetic film 12, but formed on the support film 10 by electroless plating, so that the metallic foil 11 can be formed very thinly and uniformly. Thus, a thin-type magnetism suppressing sheet having high electromagnetic wave noise absorbing performance can be realized.

Figure 5A:
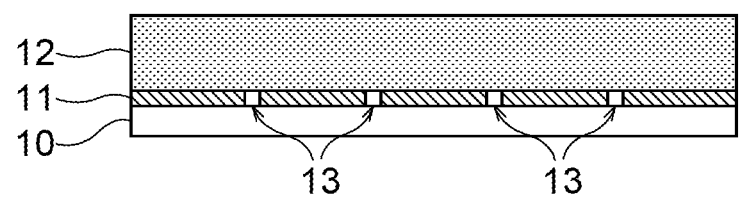
FIG. 5A is a schematic cross-sectional view illustrating a structure of a magnetism suppressing sheet according to a third embodiment of the present invention.
Figure 5B:
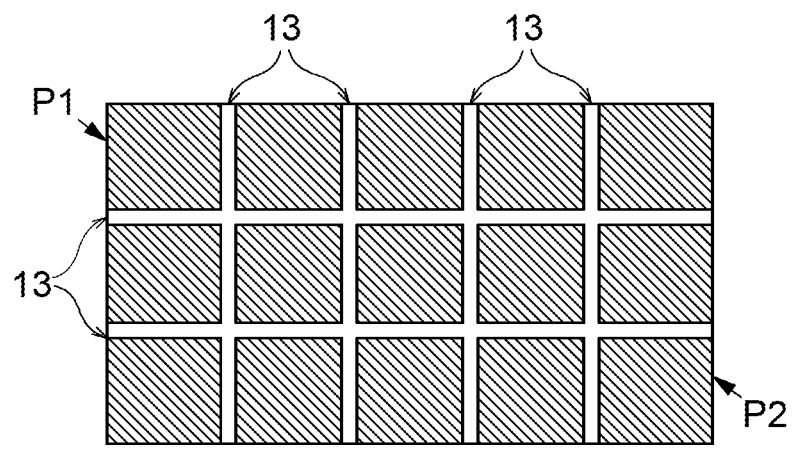
FIG. 5B is a schematic plan view illustrating a structure of a magnetism suppressing sheet according to a third embodiment of the present invention.

FIGS. 5A and 5B are views each illustrating a structure of a magnetism suppressing sheet according to a third embodiment of the present invention. FIG. 5A is a schematic cross-sectional view, and FIG. 5B is a schematic plan view.

As illustrated in FIGS. 5A and 5B, in a magnetism suppressing sheet 3, a lattice-like slit 13 is formed in the metallic foil 11, whereby the metallic foil 11 is divided into a plurality of blocks. Although not especially limited, when a planar size of the magnetism suppressing sheet 3 is 30 mm×50 mm, a dimension of one lattice of the metallic foil 11 can be set to 10 mm×10 mm, and a width of each of the lattice-like slits 13 can be set to 100 μm.

In the magnetism suppressing sheet 1 illustrated in FIG. 1, the metallic foil 11 has a solid pattern that covers the entire surface of the support film 10, and thus an end surface of the metallic foil 11 is exposed over the entire periphery of the magnetism suppressing sheet 1. Thus, electrical conduction between two arbitrary points on an outer periphery of the magnetism suppressing sheet 1 is ensured, which may cause short-circuit between surrounding components. However, in the magnetism suppressing sheet 3, the metallic foil 11 is divided into a plurality of blocks, and the blocks are insulated and separated from each other, thus preventing occurrence of short-circuit between surrounding circuits or components. That is, as illustrated in FIG. 5S, electrical connection between a point P1 and a point P2 on the outer periphery of the magnetism suppressing sheet 3 can be disconnected by the slit 13 to thereby prevent short-circuit between circuits or components.

Further, when the metallic foil 11 has the solid pattern, adhesion of the support film 10 to the entire surface of the magnetism suppressing sheet 1 is high; on the other hand, when the metallic foil 11 is divided at certain intervals by the slit 13, a part of the support film 10 that has low adhesion exists at constant intervals in a planar direction, thereby allowing easy removal of the support film 10 from the metallic foil 11.

Figure 6:
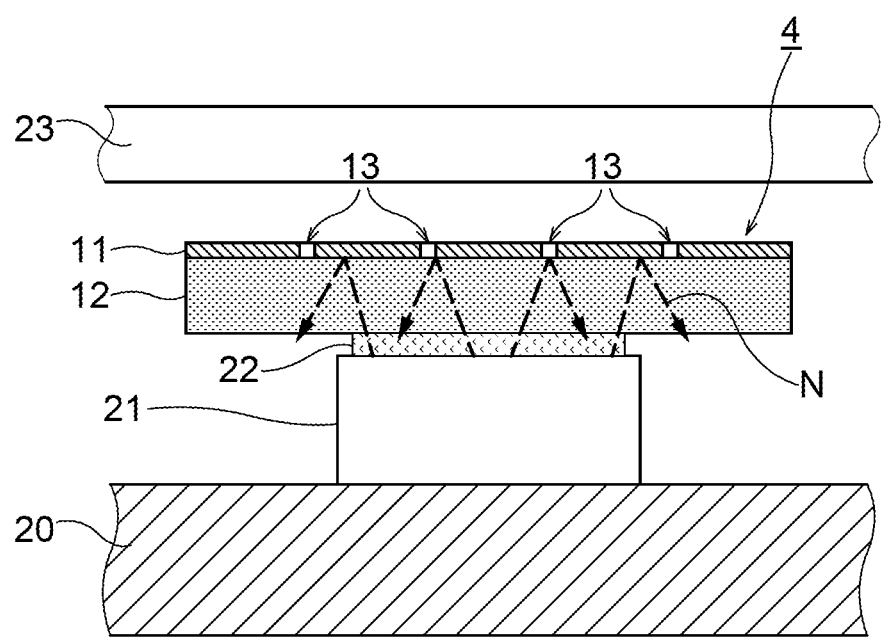
FIG. 6 is a schematic cross-sectional view illustrating a structure of a magnetism suppressing sheet according to a fourth embodiment of the present invention together with an example of a use state thereof.

FIG. 6 is a schematic cross-sectional view illustrating a structure of a magnetism suppressing sheet according to a fourth embodiment of the present invention together with an example of a use state thereof.

As illustrated in FIG. 6, a magnetism suppressing sheet 4 is obtained by removing the support film 10 from the magnetism suppressing sheet 3 according to the third embodiment and includes a metallic foil 11 and a magnetic film 12 formed on one main surface (upper surface) of the metallic foil 11. The magnetism suppressing sheet 4 is bonded to an upper surface of a noise source (electronic component 21) on a printed board 20 through an adhesive layer 22 with the magnetic film 12 facing the electronic component 21 side.

When a resin cover 23 functioning as a casing is closely disposed above the magnetism suppressing sheet 4 bonded to the upper surface of the electronic component 21 as the noise source to almost eliminate a possibility that the metallic foil 11 of the magnetism suppressing sheet 4 contacts other metallic components, the support film 10 as the insulating coating material becomes unnecessary and may disadvantageously cause increase in thickness or weight of the magnetism suppressing sheet. In such a case, by using the magnetism suppressing sheet 4 of the present embodiment in which the support film 10 has been removed, reduction in thickness and weight of the magnetism suppressing sheet can be achieved. Further, in the magnetism suppressing sheet 4 according to the present embodiment, the metallic foil 11 has the lattice-like slit 13, thereby allowing easy removal of the support film 10.

Figure 7:
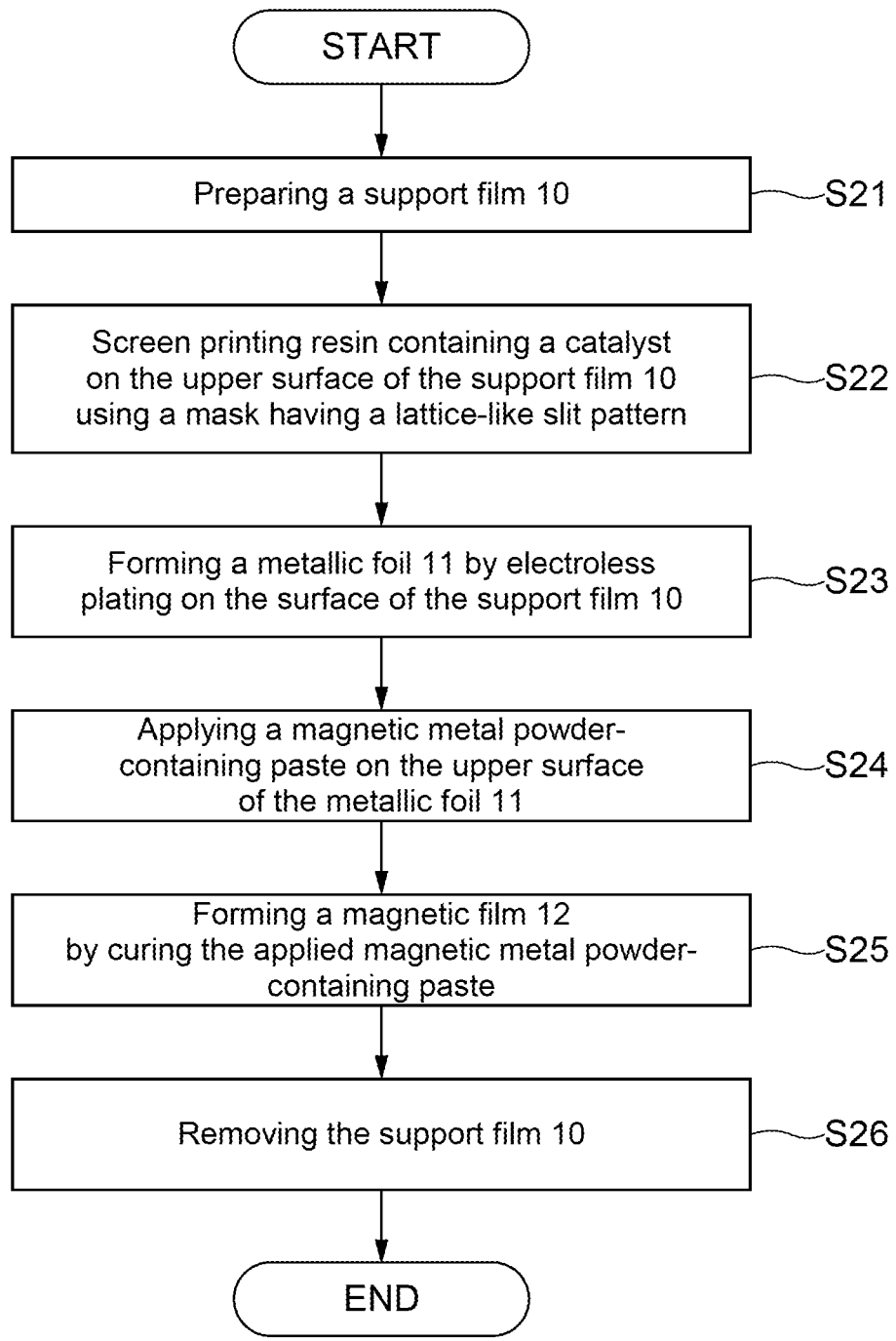
FIG. 7 is a flowchart for explaining a manufacturing method of the magnetism suppressing sheet.

FIG. 7 is a flowchart for explaining a manufacturing method of the magnetism suppressing sheet 3.

As illustrated in FIG. 7, in a manufacturing process of the magnetism suppressing sheet 3, a support film 10 is prepared first (step S21), and then resin containing a catalyst is formed, by application, on the surface of the support film 10 (step S22). At this time, a mask having a lattice-like slit pattern is used to form the resin containing the catalyst by screen printing. For example, as the support film 10, a PET film having a thickness of 20 μm can be used. Further, palladium can be used as the catalyst, and epoxy resin can be used as the resin.

Subsequently, a metallic foil 11 is formed by, electroless plating, on the surface of the support film 10 to which the resin containing the catalyst has been applied (step S23). The material of the metallic foil 11 is preferably Cu, and the thickness of the metallic foil 11 is preferably in a range of 1 μm to 5 μm. The metallic foil 11 is not plated in an area (slit pattern) where the epoxy resin containing the catalyst has not been applied, so that the metallic foil 11 is formed so as to be divided by the lattice-like slit 13 into a plurality of blocks as illustrated in FIG. 5B.

Subsequently, a magnetic film 12 having a thickness of 25 μm to 100 μm is formed on the upper surface of the metallic foil 11. Specifically, the magnetic film 12 can be formed by applying a magnetic metal powder-containing paste on the upper surface of the metallic foil 11 and curing the applied magnetic metal powder-containing paste (steps S24 and S25). Through such processes, the magnetism suppressing sheet 3 illustrated in FIGS. 5A and 5B is completed. Further, by removing the support film 10 from a laminated body of the metallic foil 11 and magnetic film 12 as necessary (step S26), the magnetism suppressing sheet 4 illustrated in FIG. 6 is completed.

As described above, in addition to the effect obtained by the first embodiment, the magnetism suppressing sheet 3 according to the present embodiment can provide an effect that the support film 10 can be easily removed. Further, it is possible to significantly reduce a probability of occurrence of short-circuit between the circuits or components surrounding the magnetism suppressing sheet 3 through the magnetism suppressing sheet 3.

It is apparent that the present invention is not limited to the above embodiments, but may be modified and changed without departing from the scope and spirit of the invention.

For example, in the above respective embodiments, PET and Cu are exemplified as the materials for the support film 10 and the metallic foil 11, respectively; however, the material of the support film 10 and the metallic foil 11 are not limited to these materials. Another resin material such as polypropylene or polyimide can be used for the support film 10, and another metal material such as Au or Pt can be used for the metallic foil 11.

What is claimed is:

1. A magnetism suppressing sheet comprising:
   a metallic foil in which a lattice-like slit is formed; and
   a magnetic film formed on one main surface of the metallic foil,
   wherein a material of the metallic foil is Cu,
   wherein the metallic foil is divided into a plurality of blocks that are electrically insulated and separated from each other by the slit, and
   wherein a thickness of the metallic foil is 1 μm to 5 μm and a thickness of the magnetic film is 25 μm to 100 μm, thereby a total thickness of the magnetism suppressing sheet is 26 μm to 105 μm.

2. The magnetism suppressing sheet as claimed in claim 1,
wherein the metallic foil is formed by plating, and
wherein the magnetic film is formed by applying magnetic metal powder-containing resin paste to the one main surface of the metallic foil.

3. The magnetism suppressing sheet as claimed in claim 2, further comprising a support film that is made of insulating material and supports the metallic foil,
wherein the metallic foil is formed by electroless plating on one main surface of the support film.

4. The magnetism suppressing sheet as claimed in claim 3, wherein a material of the support film is PET.

5. The magnetism suppressing sheet as claimed in claim 2, wherein the magnetism suppressing sheet is installed so that the magnetic film faces a noise source side.

6. The magnetism suppressing sheet as claimed in claim 1, further comprising a support film that is made of insulating material and supports the metallic foil.

7. The magnetism suppressing sheet as claimed in claim 6, wherein a material of the support film is PET.

8. The magnetism suppressing sheet as claimed in claim 1, wherein the magnetism suppressing sheet is installed so that the magnetic film faces a noise source side.

9. A magnetism suppressing sheet comprising:
a metallic foil that is electrically conductive and free from magnetism; and
a magnetic film directly formed on the metallic foil,
wherein the metallic foil has a slit that divides the metallic foil into a plurality of sections so that the sections are electrically insulated from one another,
wherein the metallic foil is made of Cu, and
wherein a thickness of the metallic foil is 1 µm to 5 µm and a thickness of the magnetic film is 25 µm to 100 µm, thereby a total thickness of the magnetism suppressing sheet is 26 µm to 105 µm.

10. The magnetism suppressing sheet as claimed in claim 9, wherein the magnetic film is directly exposed to the slit.

11. The magnetism suppressing sheet as claimed in claim 10, further comprising a support film that is electrically insulating,
wherein the metallic foil is sandwiched between the support film and the magnetic film, and
wherein the support film is directly exposed to the slit so that the support film directly faces the magnetic film via the slit.

12. A device comprising:
a substrate;
an electronic component mounted on the substrate; and
a magnetism suppressing sheet attached to the electronic component by an adhesive,
wherein the magnetism suppressing sheet comprises:
a metallic foil that is electrically conductive and free from magnetism; and
a magnetic film formed on the metallic foil,
wherein the metallic foil has a slit that divides the metallic foil into a plurality of sections so that the sections are electrically insulated from one another,
wherein the magnetic film is positioned between the metallic foil and the electronic component, and
wherein the metallic foil is made of Cu, and
wherein a thickness of the metallic foil is 1 µm to 5 µm and a thickness of the magnetic film is 25 µm to 100 µm, thereby a total thickness of the magnetism suppressing sheet is 26 µm to 105 µm.

* * * * *